United States Patent
Uchida et al.

[11] Patent Number: 5,849,465
[45] Date of Patent: Dec. 15, 1998

[54] PHOTOSENSITIVE TITANIUM CARBOXYDIKETONATE AND TITANIUM CARBOXYKETOESTER PRECURSOR SOLUTIONS AND METHOD OF PATTERNING INTEGRATED CIRCUITS USING THE SAME

[75] Inventors: Hiroto Uchida, Colorado Springs, Colo.; Katsumi Ogi, Saitama, Japan; Nobuyuki Soyama, Colorado Springs, Colo.

[73] Assignees: Symetrix Corporation, Colorado Springs, Colo.; Mitsubishi Materials Corporation, Japan

[21] Appl. No.: 747,146

[22] Filed: Nov. 8, 1996

[51] Int. Cl.$^6$ .................................................. G03C 5/00
[52] U.S. Cl. .................. 430/325; 430/270.16; 430/327; 430/330; 430/947
[58] Field of Search ............................. 430/270.16, 325, 430/327, 330, 947; 556/55; 505/734

[56] References Cited

U.S. PATENT DOCUMENTS

| | | |
|---|---|---|
| 4,883,741 | 11/1989 | Takahashi et al. ............... 430/270 |
| 5,021,398 | 6/1991 | Sharma et al. ..................... 505/1 |
| 5,384,076 | 1/1995 | Sato et al. ......................... 252/518 |
| 5,428,103 | 6/1995 | Friebe et al. ....................... 524/731 |

OTHER PUBLICATIONS

Micro–Patterning of PbZr$_x$Ti$_{1-x}$O$_3$ Thin Films; By Photo Sensitive Sol–Gel Solution; Aug. 21, 1993.

VLSI Technology; Second Edition; By S.M. Sze; Copyright 1988; pp. 141–179.

*Primary Examiner*—Janet C. Baxter
*Assistant Examiner*—Rosemary Ashton
*Attorney, Agent, or Firm*—Duft, Graziano & Forest, P.C.

[57] ABSTRACT

A photosensitive liquid precursor solution including titanium carboxyketoesters or titanium carboxydiketonates polymerizes upon exposure to ultraviolet radiation. The solution is applied to an integrated circuit substrate, masked, and exposed to ultraviolet radiation to pattern the liquid precursor film. Unexposed portions of the film are removed in a developer solution including alcohol and water. The remaining portion of the film constitutes a pattern that may be annealed to form a metal oxide.

18 Claims, 9 Drawing Sheets

PHOTOSENSITIVE TITANIUM CARBOXYDIKETONATE AND TITANIUM CARBOXYKETOESTER PRECURSOR SOLUTIONS AND METHOD OF PATTERNING INTEGRATED CIRCUITS USING THE SAME

BACKGROUND OF THE INVENTION

1. Field of the Invention

The present invention pertains to the field of liquid solutions that are used to make thin film metal oxides for use in integrated circuit devices. More specifically, the liquid solutions of the invention are photosensitive metal organic solutions that may be patterned under a mask by exposure to ultraviolet radiation.

2. Statement of the Problem

Integrated circuit devices are made of thin films deposited over a supportive substrate. Manufacturing processes often require the patterning of thin film layers to define integrated circuit devices. For example, the making of an integrated circuit may require patterning to define a capacitor. Special patterning techniques are required to produce the extraordinarily fine resolutions demanded in integrated circuit applications. Manufacturing techniques that use a photosensitive liquid precursor solutions to produce a corresponding patterned metal oxide offer the advantage of simpler and less costly processing, as compared to conventional patterning techniques.

Lead zirconium titanate materials have recently been produced using photosensitive precursor solutions and patterning techniques. Nakao et al, Micro-Patterning of $PbZr_xTi_{1-x}O_3$ Thin films Prepared By Photo Sensitive Sol-Gel Solution, 32 Jpn. J. Appl. Phys. 4141–4143 (1993), teaches the boiling of a mixture including of lead acetate trihydrate with 2-methoxyethanol to dehydrate the trihydrate. Zirconium tetra n-butoxide and titanium tetra isopropoxide are added to the partially cooled solution to commence a complexation reaction. Acetyl acetone is added to the mixture to quench the complexation and stabilize the solution. Water is added to the solution to facilitate hydrolysis. The solution is distilled to obtain 10% PZT in 2-methoxyethanol, which yields high resolution micropatterns after ultraviolet irradiation and calcination in an oxygen furnace.

The Nakao et al solution is similar to sol-gel solutions that rely upon the condensation polymerization of alkoxide ligands to gel the solution. A problem with this type of solution is that it must be prepared on-site immediately prior to use because the condensation reaction proceeds until the solution can no longer be used. Thus, it is difficult or impossible to prepare large quantities of these solutions at a plant specializing in these materials. The need to prepare these solutions on-site adds expense and complexity. Additionally, even on-site, variations in the degree of polymerization over time are ultimately associated with differences in PZT film thicknesses derived from these solutions.

There remains a need for photosensitive liquid precursor solutions that are truly shelf-stable. Manufacturers have to rely upon conventional patterning techniques to avoid the effects of time in degrading photosensitive solutions after they are mixed to a state that is made-ready for application to an integrated circuit substrate.

Conventional integrated circuit patterning techniques are taught in standard instructional texts, e.g., Size, S. M., *VLSI Technology* (Second Edition), McGraw-Hill, pp. 141–179 (1988), and use traditional lithographic techniques. A chemical resist is applied over the thin film layers that are to be patterned. A mask is positioned between the resist-covered layers and a source of ions or electromagnetic radiation. Lithography techniques are subclassified into those involving optical, electron, X-ray, and ion sources, depending upon what the resist requires for reaction to form a pattern. The mask forms either a positive or negative image of the desired pattern depending upon what type of resist is used. The resist may be a positive resist or a negative resist. In a positive resist, exposure to incident radiation or ions breaks chemical bonds to permit dissolution of the resist in a developer solution. In negative resists, exposure to incident radiation or ions polymerizes or crosslinks the resist to make it insoluble in the developer solution. Ultraviolet radiation is used to expose some types of resists, and these are classified as 'optical' resists.

The substrate including a mask area of developed resist is etched to form a pattern in the thin film layers. The pattern is formed because the resist protects the areas that it covers while the etchant removes thin film materials which are not covered by the resist. According to Size, S. M., *VLSI Technology* (Second Edition), McGraw-Hill, pp. 184–228 (1988), conventional etching techniques include reactive ion etching, reactive plasma etching or reactive sputter etching, and reactive ion beam etching. These techniques produce a chemically active etchant species (e.g., as by the ionization and fragmentation of gasses) that reacts with unmasked solid surfaces to form volatile or easily-removed reaction products. Thus, thin film layers are removed in the unmasked areas. Chemical etchants may also be used, but these processes are discouraged because they are anisotropic and, consequently, unsuited for fine-line patterning (see Size, S. M., *VLSI Technology* (Second Edition), McGraw-Hill, p. 396 (1988)).

The remaining resist must be removed or stripped after the thin film layers have been etched, in order to clear the way for deposition of subsequent layers. Stripping of the resist is normally done through conventional chemical processes depending upon which type of resist is used. Stripping techniques normally include dissolving the resist in a suitable chemical recommended by the resist manufacturer, and rinsing the remaining solution from the substrate.

The conventional patterning steps are associated with additional process complexity because they create needs for further process steps. For example, etching induces cracks or fatigue in the patterned thin film layers. Thus, it is highly desirable to anneal the patterned device subsequent to the etching step, in order to remove or heal cracks in the patterned layers. Additionally, it is possible to use liquid precursor solutions (e.g., sol-gels) to yield the thin film metal oxide layers that will be patterned. It is necessary to dry and anneal these solutions prior to the application of resist for patterning the underlying metal oxide layer.

The foregoing discussion makes it clear that the patterning of integrated circuits is a complex procedure that significantly adds to the time and cost of manufacture. The requisite steps of applying the resist, exposing the resist, etching the resist, and stripping the resist, must normally be done numerous times before the process of making an integrated circuit is complete. Each step is associated with a variety of critical factors that can affect process yield, such as exposure time and intensity of radiation, quality of the respective resist and developer solutions, etching time, temperature, humidity, and pressure.

There is a true need for shelf-stable photosensitive liquid precursor solutions of the type that may be used in a shortened integrated circuit patterning process which avoids one or more of the conventional patterning steps. The shortened process should be associated with reduced costs and complexity together with a higher process yield. The shortened process must also be capable of providing the fine resolution that is required for integrated circuit applications.

SOLUTION

The present invention overcomes the problems outlined above by providing a shelf-stable photosensitive liquid precursor solution. The solution may be mixed to a state that is made-ready for application to an integrated circuit substrate and shipped from a central chemical facility to facilities that use a photosensitive patterning process to make integrated circuits.

The liquid solution includes materials that react to polymerize the solution when it is exposed to ultraviolet radiation. The solutions remain usable for extended periods of time while they are protected from exposure to ultraviolet radiation. The monomers for the polymerization reaction are titanium carboxyenolate compounds that are preferably selected from the group consisting of titanium carboxydiketonates, titanium carboxyketoesters, and mixtures thereof. Additional metal organic compounds and a solvent are mixed with the titanium compound in molar proportions that are effective for yielding a metal oxide film upon drying and annealing of the liquid solution. It is believed that the exceptional shelf-stability of these solutions exists because the carboxylate ligands of the titanium carboxyenolate compound are normally resistant to condensation reactions. These solutions destabilize upon exposure to ultraviolet radiation, and react to polymerize the solution.

The polymerization occurs in fine patterns that are acceptable for use in integrated circuits. A polymer micropattern may be established in a film of the solution by exposing a solution film to ultraviolet radiation under a mask. High pattern resolution is achieved by keeping the concentration of the titanium carboxyenolate compound within limits. The titanium carboxyenolate compound preferably has a concentration greater than a normality of 0.1 moles per kilogram of solution. This concentration most preferably ranges from 0.1 to 0.3 moles per kilogram.

Unpolymerized portions of the ultraviolet radiation-exposed solution film are washed away when the film is developed. The preferred developer solution is a mixture of alcohol and water that dissolves the unpolymerized portions of the film while leaving the polymerized portions on the substrate. Any remaining developer solution is removed in a rinsing step, which preferably occurs in an n-butylacetate wash.

As indicated above, the metal organic liquid solution preferably includes a plurality of metals in molar proportions that are designed to yield a desired solid metal oxide when the liquid solution is annealed in an oxygen-containing atmosphere. For example, a precursor for making $(Ba_{0.7}Sr_{0.3})TiO_3$ has equimolar amounts of a titanium metal organic compound (a perovskite B-site metal) and a 70/30 mixture of barium and strontium metal organic compounds (perovskite A-site metals). The ratio of barium to strontium to titanium metal organic compounds in the precursor is 0.7:0.3:1, with the ratio of total A-site metals to B-site metals being 1:1. The materials may also be doped with other metals including A and B-site elements to provide a nonstoichiometric balance of A and B-site elements. In this instance, the ratio of A-site metals to B-site metals preferably varies from 0.9 to 1.1.

The solutions include the metals that will be incorporated in the metal oxide, but do not necessarily need to be mixed in the exact stoichiometric proportions of the metal oxide. Vapor losses sometimes occur during the anneal. Thus, the solutions should be compensated for anticipated vapor losses in high vapor loss elements, such as bismuth. When bismuth is added to the solution, a five to ten percent excess quantity of bismuth is preferred to compensate the solution for anticipated vapor loss of bismuth. Atmospheric oxygen supplements the oxygen in solution during the anneal. Thus, the liquid solution does not need to supply all of the required oxygen.

Particularly preferred metal oxides that may be produced from these liquid solutions include perovskites. These materials are often useful as high dielectrics, ferroelectrics, or materials that are both high dielectrics and ferroelectric. Lead zirconium titanate and lead lanthanum zirconium titanate are preferred perovskites. Barium strontium titanate is most preferred. The barium strontium titanate formulation is $$(Ba_xSr_{1-x})TiO_3, \quad (1)$$

wherein X is a number from zero to one. The variation of X between zero and one controls the ferroelectric Curie temperature and the dielectric constant. Circuit designers can, accordingly, use Formula (1) to design materials having optimum performance in an intended environment of use. Barium strontium titanate materials having an X value equal to or greater than about 0.7 are generally considered to be high dielectrics alone, and materials having an X value of less than about 0.6 begin to exhibit useful ferroelectricity at integrated circuit operating temperatures. The most preferred formulation of barium strontium titanate is $(Ba_{0.7}Sr_{0.3})TiO_3$, which is not ferroelectric at the normal operating temperatures for integrated circuits. The metal organic portion of liquid solutions used to make perovskites preferably includes strontium, barium, titanium, lead, zirconium, or lanthanum, as well as mixtures of these metals.

In addition to the above ingredients an anhydride is preferably added to the solution to eliminate water and prevent polymerization of metal alkoxides in solution until subsequent reactions in the manufacturing process substantially eliminate alkoxide ligands from solution. The addition of an anhydride scavenges water from the reaction mixture as the solution is being made, and prevents premature condensation polymerization.

Preferred techniques for depositing a film of the liquid solution onto an integrated circuit substrate include spin-coating the solution and misting the solution. The deposited solution is polymerized by exposure to ultraviolet radiation using a mask to block ultraviolet radiation from areas where the film is to be removed. The unpolymerized portion of the film is removed in a developer solution that preferably contains a mixture of alcohol and water. Excess developer solution is rinsed away, preferably, in n-butyl acetate. After the rinse, the patterned film is dried on a hot plate and annealed to form a patterned metal oxide.

Other features, objects, and advantages will be apparent to those skilled in the art upon a reading of the discussion below in combination with the accompanying drawings.

DETAILED DESCRIPTION OF THE PREFERRED EMBODIMENT

Figure 1:
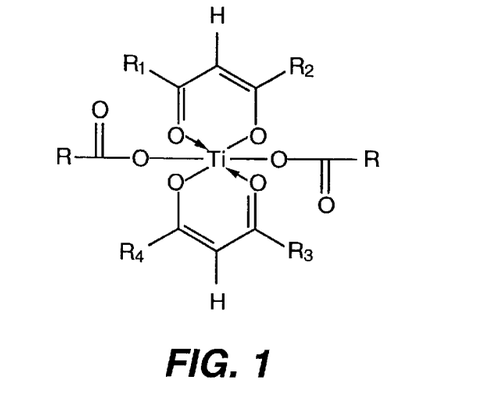
FIG. 1 depicts a preferred titanium carboxyβ-diketonate for use in the present invention.

FIG. 1 depicts the molecular structure of a preferred titanium metal organic compound for use in the present invention, namely, a titanium β-diketonate. In FIG. 1, R, $R_1$, $R_2$, $R_3$, and $R_4$ are, respectively, aliphatic hydrocarbon chains having from one to five carbon atoms, and are more preferably alkyl chains selected from the group consisting of methyl, ethyl, n-propyl, isopropyl, n-butyl, sec-butyl, tert-butyl, neopentyl, and tert pentyl hydrocarbon chains. $R_2$ and $R_4$ may also be an aromatic hydrocarbons and, if so, are preferably aryl. R, $R_1$, $R_2$, $R_3$, and $R_4$ may all be different from one another, but $R_1$ and $R_3$ are preferably identical to one another, as are $R_2$ and $R_4$.

Figure 2:
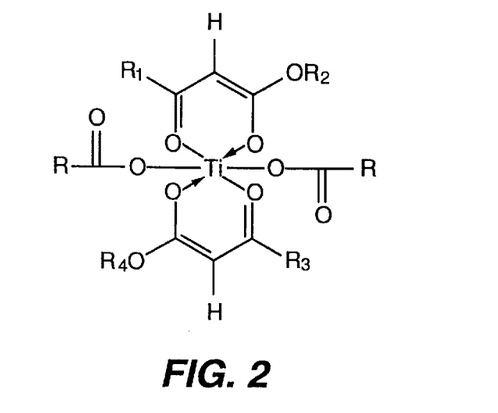
FIG. 2 depicts a preferred titanium carboxyβ-ketoester for use in the present invention.
Figure 3:
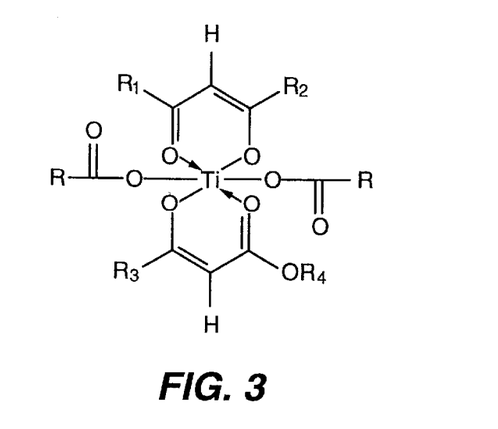
FIG. 3 depicts a preferred titanium carboxyβ-diketonateβ-ketoester for use in the present invention.

FIG. 2 depicts the molecular structure of a preferred titanium β-ketoester for use in the present invention. R, $R_1$, $R_2$, $R_3$, and $R_4$ are defined above with respect to FIG. 1. Similarly, FIG. 3 depicts a preferred titanium carboxyβ-diketonateβ-ketoester, which is a hybrid of the molecules shown in FIGS. 1 and 2.

Figure 4:
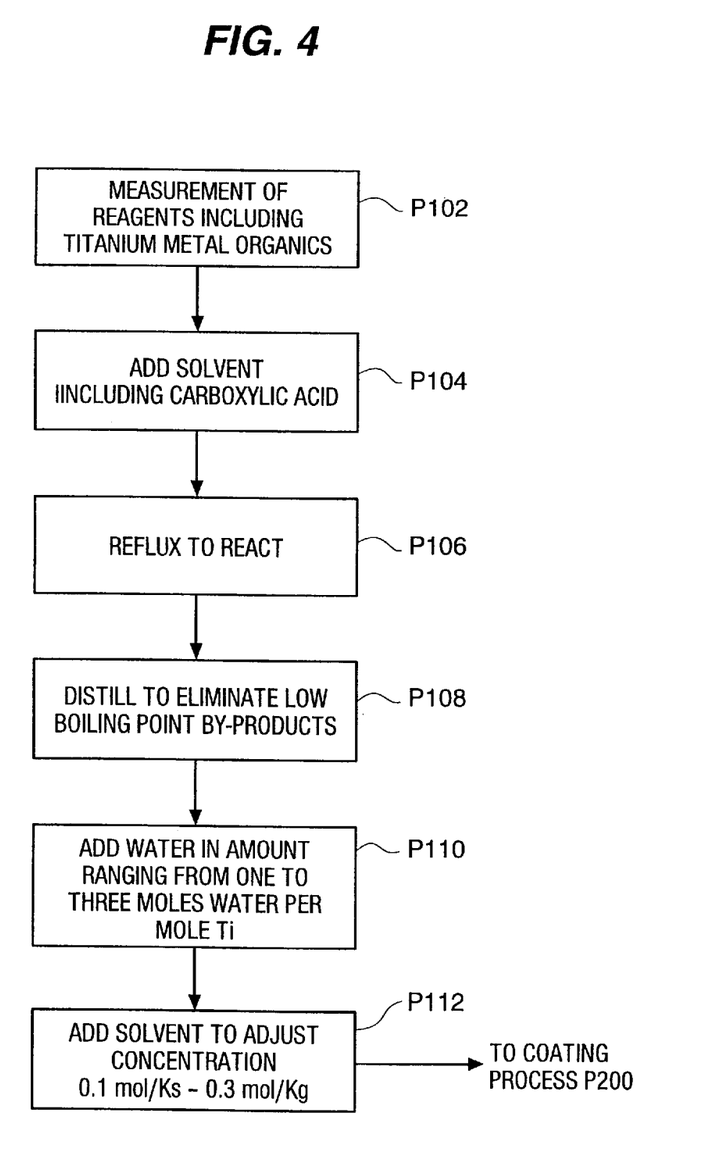
FIG. 4 depicts a schematic process diagram for use in making a photosensitive metal organic liquid solution according to the present invention.

FIG. 4 depicts a schematic process diagram of preferred process P100 for use in making liquid solutions for use according to the present invention. Step P102 includes the measurement of reagents. These reagents include a mixture of metal carboxylates, metal alkoxides, β-diketones, β-ketoesters, titanium β-diketonates, and titanium β-ketoesters.

The metals are measured and mixed to provide molar proportions representing a desired stoichiometry or empirical formula in a metal oxide to be produced using the liquid solution. A particularly preferred aspect of step P102 is that the metal organic compounds can be mixed in relative proportions which are designed to yield, upon drying and annealing of the liquid solution, a corresponding solid metal oxide of a desired stoichiometry. For example, liquid precursor solutions for perovskites having a formula $ABO_3$ are mixed to yield equal proportions of A-site and B-site metals in the metal oxides that are produced from these solutions. This concept extends to mixtures of A-site and B-site metals having similar valences and ionic radii, e.g., as in (A"A'A)(B"B'B)$O_3$ perovskites. Examples of these mixed perovskites include (A'A)$BO_3$, A(B'B)$O_3$, and (A'A)(B'B)$O_3$ perovskites. Dopants may also be added to either induce or compensate defects in the perovskite lattice. These dopants include Especially preferred perovskites include barium strontium titanate, lead titanate, lead zirconium titanate, and lead lanthanum zirconium titanate.

Layered superlattice materials may also derive from photosensitive liquid solutions according to the invention. These materials include those such as the strontium bismuth tantalate materials discussed in U.S. Pat. No. 5,434,102, which is hereby incorporated by reference to the same extent as though fully disclosed herein. Layered superlattice materials are normally ferroelectric, and are also high dielectrics.

The term "layered superlattice material" is used herein because no well-defined accepted term exists in the art to describe these type of materials. Layered superlattice materials at least include all three of the Smolenskii-type ferroelectric layered superlattice materials, namely, those having the respective average empirical formulae:

$$A_{m-1}S_2B_mO_{3m+3}; \quad (2)$$

$$A_{m+1}B_mO_{3m+1}; \quad (3)$$

and $$A_mB_mO_{3m+2}, \quad (4)$$

wherein A is an A-site metal in the perovskite-like superlattice, B is a B-site metal in the perovskite-like superlattice, S is a trivalent superlattice-generator metal such as bismuth or thallium, and m is a number sufficient to balance the overall formula charge. Where m is a fractional number in the overall formula, the formula typically provides for a plurality of different or mixed perovskite-like layers each having a different integer value. The A-site metals and B-site metals may include mixtures of cations having similar ionic radii.

The superlattice-generator layers, S, include oxides of bismuth (III) other similarly sized trivalent metal cations such as thallium (III). Bismuth also functions as an A-site metal in the perovskite-like lattice if it is present in excess of the stoichiometrically required amount for generating the layered superlattice material according to Formula (2). The most preferred layered superlattice materials include strontium bismuth tantalate, strontium bismuth niobate, and strontium bismuth niobium tantalate. Additionally, it can be advantageous to provide these materials with a mixture of B-site elements including vanadium and tungsten. Bismuth titanate is a layered superlattice material wherein bismuth is both the superlattice generator element and the A-site metal.

These reactions may be used to prepare metal alkoxides and metal carboxylates:

$$\text{Metal alkoxides—}M^{+N} + N\ R'\text{—OH} \rightarrow M(\text{—O—}R')_N + N/2\ H_2; \quad (5)$$

and wherein M is a metal having an oxidation state of N; and R' is an aliphatic hydrocarbon chain having from one to five carbon atoms, and is more preferably an alkyl chain selected from the group consisting of methyl, ethyl, n-propyl, isopropyl, n-butyl, sec-butyl, tert-butyl, neopentyl, and tert pentyl hydrocarbon chains.

The inclusion of a titanium carboxyβ-diketonate, titanium carboxyβ-ketoester or B-site metal homologue thereof is believed to be an essential feature of practicing the present invention because the ultraviolet radiation-induced polymerization reaction is believed to occur in these compositions. Other perovskite B-site elements may sometimes be substituted for the titanium, but the desired ultraviolet-induced polymerization reaction sometimes does not occur in other metal diketonates and metal ketoesters. The reagents of step P102 are preferably selected to provide in a further reacting step the titanium diketonates and titanium ketoesters shown in FIGS. 1–3.

Figure 5:
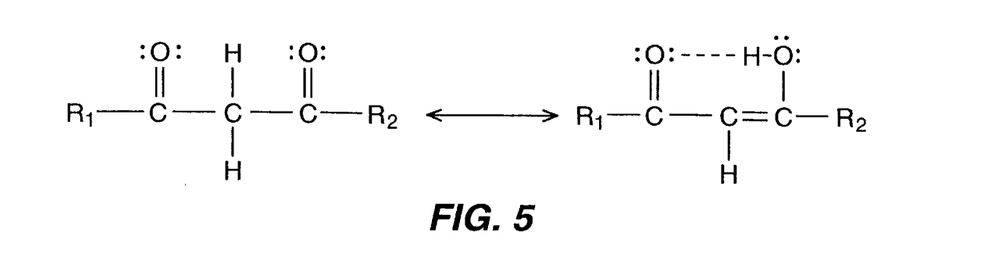
FIG. 5 depicts a tautomeric relationship between a β-diketone and a conjugated enol configuration.
Figure 6:
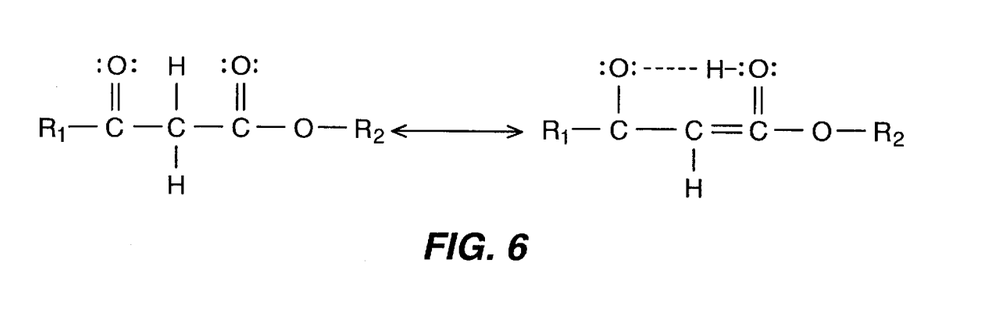
FIG. 6 depicts a tautomeric relationship between a β-ketoester and a conjugated enol configuration.

The desired titanium β-diketonate or titanium β-ketoester may be prepared by reacting a titanium alkoxide or titanium carboxylate with the β-diketone shown in FIG. 5 or the β-ketoester shown in FIG. 6. FIGS. 5 and 6 show that carbonyl compounds with a carbon hydrogens are tautomers in equilibrium with vinylic alcohols. These vinylic alcohols are commonly referred to as enols. The enol configuration of a β-diketone (FIG. 5) or β-ketoester (FIG. 6) is stabilized by a conjugate π-bond system. Thus, it is preferred in step P102 to add β-diketones or β-ketoesters according to FIGS. 5 and 6 if the beginning titanium compounds are titanium alkoxides or titanium carboxylates. This preference exists because the conjugate π system drives the eventual reaction to a greater degree of completion in the substitution of β-diketonate groups or β-ketoester groups for alkoxide and carboxylate groups. This substitution stabilizes the resultant product against hydrolysis and other side reactions that could in some cases result in the unwanted precipitation of titanium metals from solution.

It is also possible to provide commercially available compounds, such as titanium alkoxydiketonates, titanium carboxydiketonates, titanium alkoxyketoesters, or titanium carboxyketoesters, such as:

and wherein R is defined with respect to FIG. 1 above; N is an integer less than four; and L—L is a diketonate or ketoester group derived from the enol configuration of molecules show in FIGS. 5 or 6, or a mixture of diketonate and ketoester groups derived from these molecules. In this alternative case, it is not necessary to add the titanium carboxylate or titanium alkoxide in combination with a diketone or ketoester. Other B-site metals having an oxidation state of four may be substituted for titanium (IV), e.g., zirconium (IV).

Suitable titanium ketoesters and titanium diketonates may be purchased on commercial order from a variety of companies including Strem, Aldrich, Dupont, and Vnpim (of Tula, Russia). Particularly preferred metal diketonates and metal ketoesters include those shown in FIGS. 1 and 2.

Step P104 includes the addition of a solvent including a carboxylic acid, $RCO_2$, wherein R is defined with respect to FIG. 1 above. The carboxylic acid acts as a solvent and is also a chelating agent that forms coordination complexes with other compounds in solution.

The carboxylic acid may be mixed with a cosolvent, as needed to dissolve the reagents added in step P102. An exemplary list of suitable cosolvents includes xylenes, 2-methoxyethanol, n-dimethylformamide, methyl isobutylketone, methyl isoamylketone, isoamyl alcohol, cyclohexanone, 2-ethoxyethanol, 2-methoxyethyl ether, methyl butyl ketone, hexyl alcohol, 2-pentanol, nitroethane, pyrimidine, 1, 3, 5-trioxane, isobutyl propionate, propyl propionate, ethyl lactate, n-butanol, n-pentanol, 3-pentanol, toluene, ethylbenzene, octane, nonane, and decane.

A particularly preferred but optional feature of Step P104 is the addition of an anhydride. The initial ingredients including metal alkoxides and metal carboxylates in Step P102 are often hygroscopic, and water tends to polymerize these films in an undesirable way. The addition of an anhydride removes free water from solution and stabilizes the solution until subsequent chemical reactions substitute stable (hydrolysis-resistant) carboxylate ligands for the alkoxide ligands and distillation eliminates the alkoxide ligands from solution. The anhydride is preferably a short-chain anhydride having fewer than ten carbon atoms.

Step P106 includes refluxing the reaction mixture. Reflux occurs at atmospheric pressure for a time that preferably ranges from about thirty minutes to about three hours or more. The increased temperature during reflux facilitates substitution reactions to produce various hydrolysis-resistant alkoxycarboxylate products, such as:

and wherein R', R", and R''' are aliphatic hydrocarbon chains having from one to five carbon atoms, and are more preferably short alkyl chains including methyl, ethyl, n-propyl, isopropyl, n-butyl, sec-butyl, tert-butyl, neopentyl, and tert pentyl groups; M is a metal having an oxidation state of N; and M' is a metal having an oxidation state of B.

Figure 7:
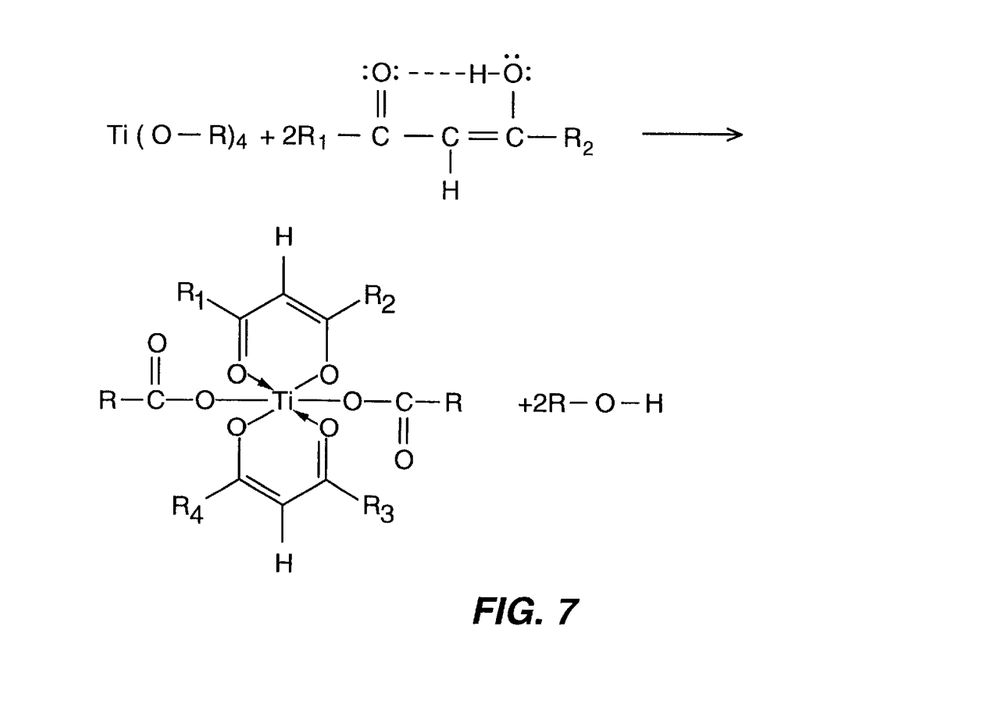
FIG. 7 depicts a reaction between a titanium alkoxide and the conjugated enol configuration of FIG. 5.
Figure 8:
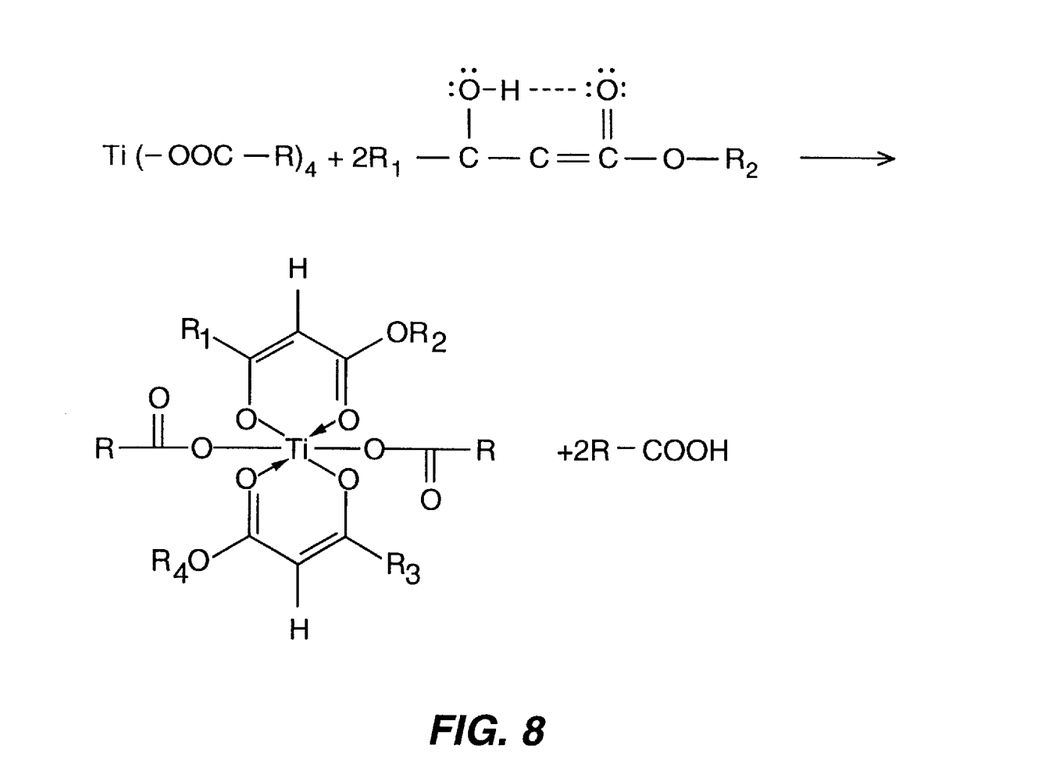
FIG. 8 depicts a reaction between a titanium carboxylate and the conjugated enol configuration of FIG. 6.

Additional reactions occur involving metal diketonates and metal ketoesters, e.g., the reaction shown in FIG. 7 in which a titanium (IV) alkoxide reacts with the enol tautomer shown in FIG. 5 to produce the titanium β-dikenonate shown in FIG. 1. FIG. 8 shows an analogous reaction between the enol tautomer of FIG. 6 and titanium (IV) carboxylate to produce the titanium ketoester shown in FIG. 2. More generally, these reactions proceed as:

and wherein M is a metal having a valence of N; B is an integer less than or equal to N; R, R1, R2, are defined above with respect to FIG. 1; and L—L is conjugate enol of the type shown in FIGS. 5 and 6 less the tautomer-shifting hydrogen.

In step P108, the reaction mixture is distilled to eliminate low boiling point organics, such as the alcohol by products of FIGS. 5 and 7 and the ether byproduct of FIG. 6.

Distillation of the solution to eliminate the reaction byproducts drives to substantial completion the reactions shown in Formulae (4)–(7) and FIGS. 7–8. Step P110 includes adding water to the distilled reaction mixture. The amount of water added preferably rangers from one to three moles of water per mole of perovskite B-site metal (e.g., titanium) in the distilled reaction mixture.

In step P112, solvent is added to the reaction mixture until a desired concentration is attained. This desired concentration preferably ranges from 0.1 mole/kg to 0.3 mole/kg based upon the number of moles of perovskite B-site metal in solution.

Figure 9:
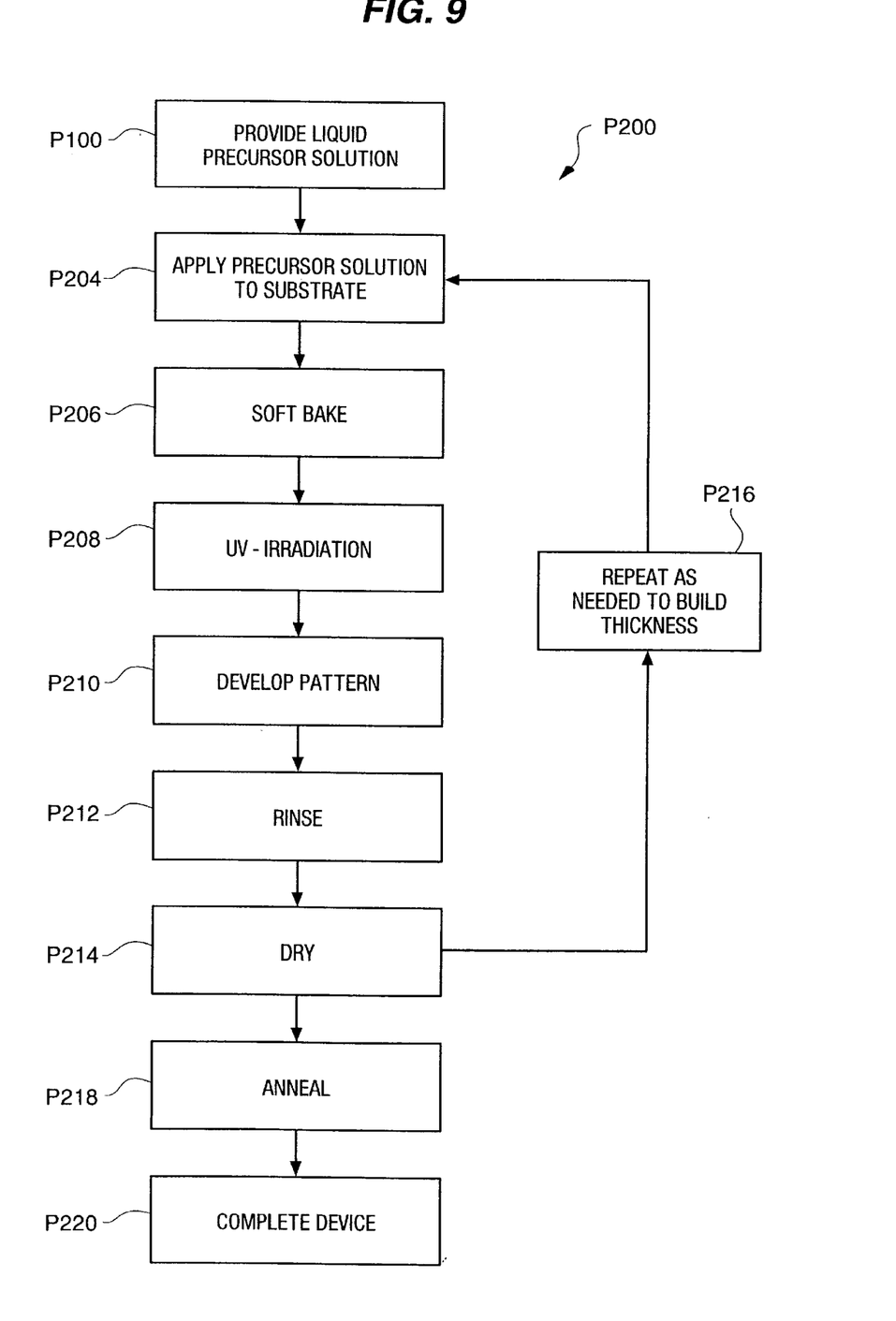
FIG. 9 depicts a schematic process diagram for use in making patterned metal oxide films according to the present invention.

FIG. 9 depicts a schematic process diagram showing process P200 for making integrated circuit devices according to the present invention. Step P100 is the process P100 shown in FIG. 4.

In step P204, the liquid precursor solution from step P100 is applied to a substrate. In the integrated circuit art, the term "substrate" is sometimes used to describe a crystalline wafer, such as silicon, ruby, sapphire, or gallium arsenide. As used herein, the term "substrate" applies to any layer or combination of layers that provides support for other layers. Thus, the term "substrate," as used herein, broadly includes the wafer in addition to other layers, such as wiring layers (e.g., Pt/Ti sputter-deposited electrodes), diffusion barrier layers (e.g., silicon nitride or titanium nitride), isolation layers (e.g., silicon dioxide or titanium dioxide), dielectrics, ferroelectrics, and any other layer that may be deposited and/or patterned prior to step P204. Accordingly, step P204 can be used in the formation of any integrated circuit device that requires a metal oxide.

The most preferred technique for depositing the liquid precursor in step P204 is that of spin-on deposition. The substrate is placed in a conventional spin-coating machine, and rotated at a velocity ranging from 500 rpm to 3000 rpm. A preferred two-tiered spin-on technique that provides excellent step coverage is to rotate the substrate at a relatively low velocity of about 500 rpm for one second while dropping the liquid solution onto the substrate using an eye dropper. The rotational velocity is then increased to a value in the range from 1000 rpm to 3000 rpm while dropping the solution for an additional thirty seconds. The result of this activity is that the substrate is coated with a thin film of the liquid precursor solution. Alternatively, a misted deposition process may be employed, such as that described in U.S. Pat. No. 5,456,945, which is hereby incorporated by reference herein to the same extent as though fully disclosed herein.

Figure 10:
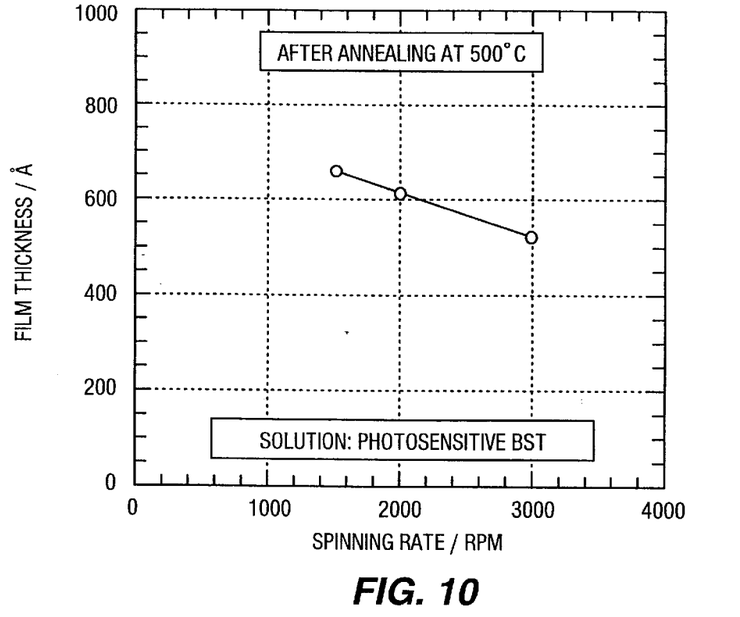
FIG. 10 depicts a graph of empirically derived data showing a relationship between metal oxide film thickness and the spin rate during deposition of a liquid precursor solution according to the invention.

FIG. 10 shows that the film thickness of the final metal oxide after the anneal can be controlled by the rate of spin in step P204 (see FIG. 9). A variation in spin rate between 1500 rpm and 3000 rpm is plotted as a substantially straight line between the corresponding thicknesses of approximately 650 Å and 500 Å.

In step P206, the substrate including the liquid precursor film from step P204 is removed from the spin-coating machine for soft-bake heating in air on a hot plate. The hot plate temperature is preferably set between 80° C. and 120° C., and heating extends for a duration of from thirty seconds to five minutes. The most preferred soft bake profile is 100° C. for one minute. Step P206 evaporates solvent to produce a semisoft film in place of the liquid precursor film from step P204.

In step P208, the soft-baked film from step P206 is exposed to ultraviolet radiation. A particularly preferred band of ultraviolet radiation for use in the invention has a wavelength ranging from about 180 nm to about 300 nm and most preferably ranges from about 220 nm to about 260 nm. These wavelengths are selected to target the C—O bonds in the precursor for dissociation.

The ultraviolet radiation is preferably applied in step P208 through a tunable eximer laser; however, other acceptable UV sources exist, such as a Danielson UV light source or a deuterium lamp. The exposure technique of step P208 preferably includes an exposure intensity ranging from one to two Joules per square centimeter. This exposure normally occurs over a period of time ranging up to about ten minutes.

Figure 11:
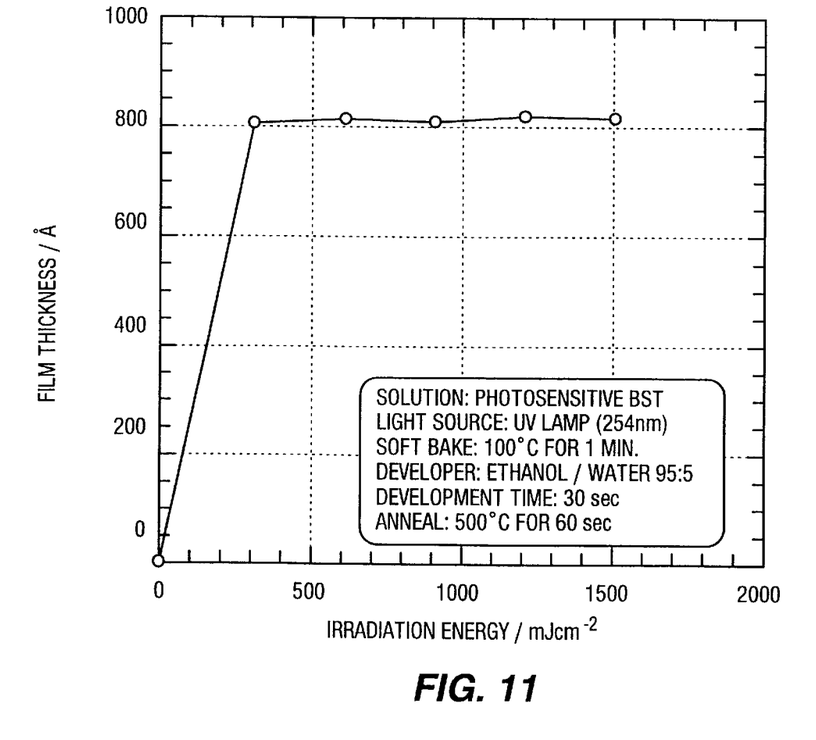
FIG. 11 depicts a graph of empirically derived data showing a minimum irradiation energy required to stabilize a film of liquid precursor solution according to the invention.

FIG. 11 shows that a minimum ultraviolet irradiation energy exposure of about 300 $mJ/cm^2$ is required in step P208 (see FIG. 9) to polymerize the liquid precursor solution film sufficiently to stabilize it against dissolution in the developer solution of step P210.

Figure 12:
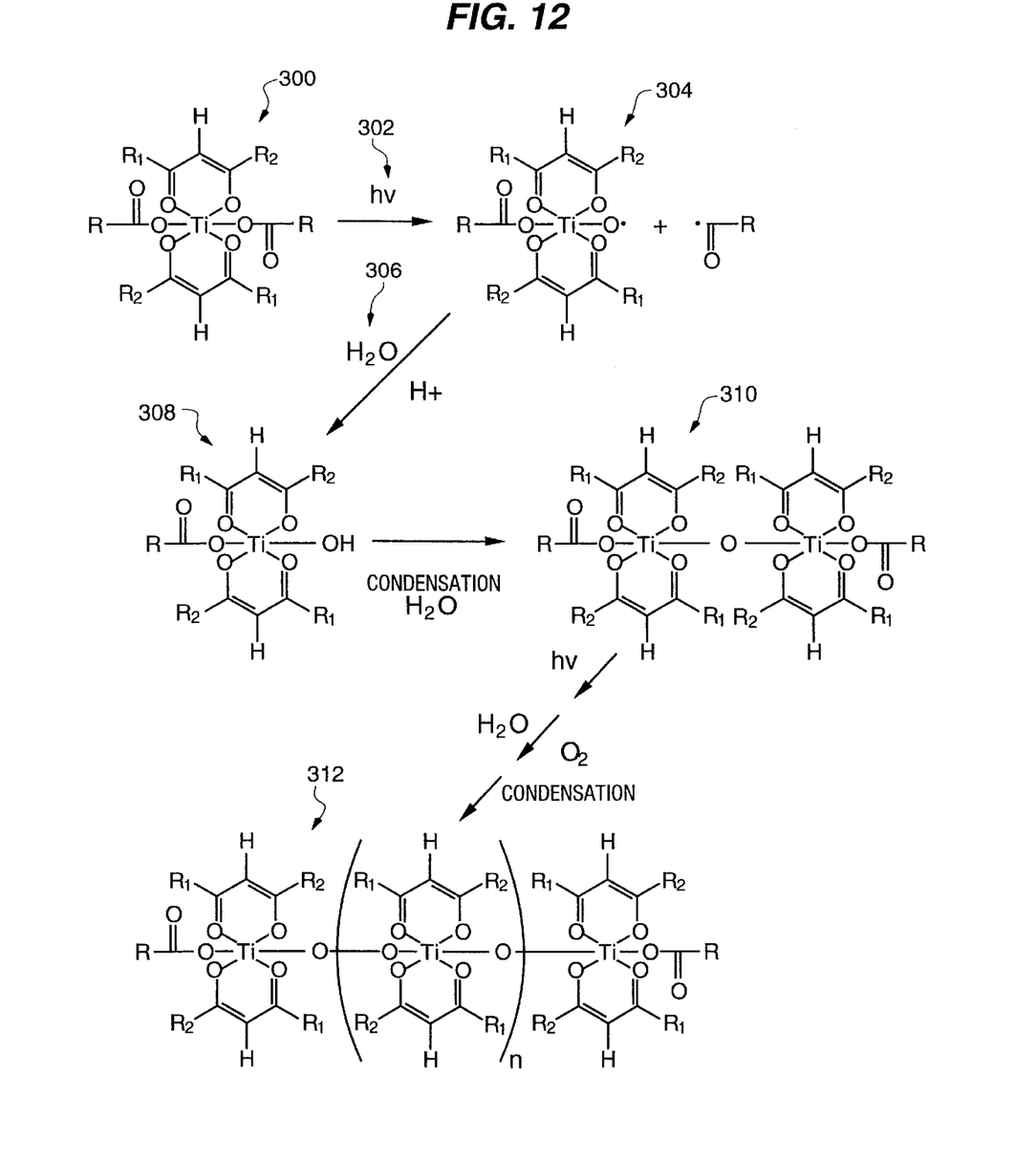
FIG. 12 depicts a generalized chemical reaction that may be used in the FIG. 9 process.

The ultraviolet-exposed pattern is rendered insoluble by a polymerization reaction. FIG. 12 depicts a generalized theory for this reaction. A compound 300 corresponding to the titanium β-diketonate or β-ketoester of FIGS. 1–3 is exposed to ultraviolet radiation 302 to generate a free radical intermediate 304. The free radical intermediate 304 reacts with water to produce a metal hydroxide 308 with the generation of protic hydrogen. In turn, the metal hydroxide 308 undergoes a condensation reaction to produce water and a short chain oligomer 310. Subsequent additions by similar mechanisms at the carboxylate sites yield a long chain polymer 312 that subsequently resists dissolution in a developer solution.

Step P210 includes developing the exposed pattern from step P208 by placing the substrate in a developer solution. The developer solution is preferably a mixture of alcohol and water with a majority alcohol component. The most preferred solution is a 20:1 mixture of ethanol and water. The preferred development time for use of this mixture ranges from thirty seconds to two minutes, with the most preferred time being one minute.

Portions of the soft baked film from step P206 that were not exposed to ultraviolet radiation in step P208 are soluble in the developer solution. Accordingly, the developer solution removes these portions of the soft baked film to leave a fine-resolution pattern consisting of the ultraviolet-exposed film portions.

Step P212 includes rinsing the patterned film on the substrate to remove excess amounts of developer solution and quench the polymerization reaction. Preferred rinses include short chain esters, such as acetates, which have a boiling point less than that of the titanium diketone or titanium ketoester which forms the patterned film. The most preferred rinse is n-butylacetate.

After rinsing in step P212, the patterned film is dried in step P214 to eliminate any remaining portions of the rinse and to facilitate the removal of remaining solvent from the original liquid precursor solution. This drying step is preferably conducted at a temperature ranging from 100° C. to 500° C. in a dry air atmosphere. The drying time and temperature should be sufficient to remove or calcine substantially all of the organic materials from the liquid thin film and leave a dried metal oxide residue. The drying time preferably ranges from about one minute to about thirty minutes. For a n-butylacetate rinse, the preferred drying profile is to heart the patterned substrate on a hot plate at 160° C. for one minute, followed by heating at 400° C. for two to ten minutes.

The maximum drying temperature is preferably greater than the boiling point of the rinse used in step P212, but less than the boiling point of the titanium diketone or titanium ketoester compound. These temperature considerations prevent bubbling of the patterned film. Bubbling is also reduced by drying the liquid film in stepped intervals. For example, the film can be dried for five minutes at 260° C. and for five minutes at 400° C. Additionally, it is preferred to conclude the drying cycle with a brief heating interval at a temperature exceeding 700° C., e.g., using a tungsten-nickel lamp to heat the substrate to 725° C. for thirty seconds. This rapid thermal heating and cooling cycle promotes nucleation and small crystal grain sizes, and also facilitates removal of the remaining organic moieties in the dried precursor film. The drying step P214 is essential in obtaining predictable or repeatable electronic properties in the final metal oxide crystal compositions.

In step P216, steps P204–P214 are optionally repeated until a sufficient thickness of the dried precursor residue is built up.

In step P218, the dried film is annealed in an oxygen-containing atmosphere to yield a metal oxide having a predetermined stoichiometry corresponding to the mixture of metals in the original liquid precursor solution less volatilization losses (e.g., as explained above for bismuth compounds). The substrate including the dried and patterned precursor residue from is heated in an oxygen diffusion furnace to a temperature ranging from 450° C. to 1,000° C. for a time ranging from thirty minutes to two hours. Step P218 is more preferably conducted at a temperature ranging from 600° C. to 800° C., with the most preferred anneal temperature being about 600° C. for eighty minutes. The anneal preferably occurs in a push/pull process including five minutes for the "push" into the furnace and five minutes for the "pull" out of the furnace. The indicated anneal times include the time that is used to create thermal ramps into and out of the furnace. In a commercial manufacturing process, it is advantageous to provide careful control of all annealing temperatures and times for purposes of providing consistent and reproducible results.

Step P220 includes completing the device. This step includes the deposition and patterning of additional layers by any means to form a complete integrated circuit device. These techniques include, for example, the sputter deposition of electrodes, etching by conventional reactive plasma or reactive ion methods to form contact holes or other subsequent device patterns, the deposition of spin-on glass additional anneals, and any other conventional technique useful in making integrated circuits.

Figure 13:
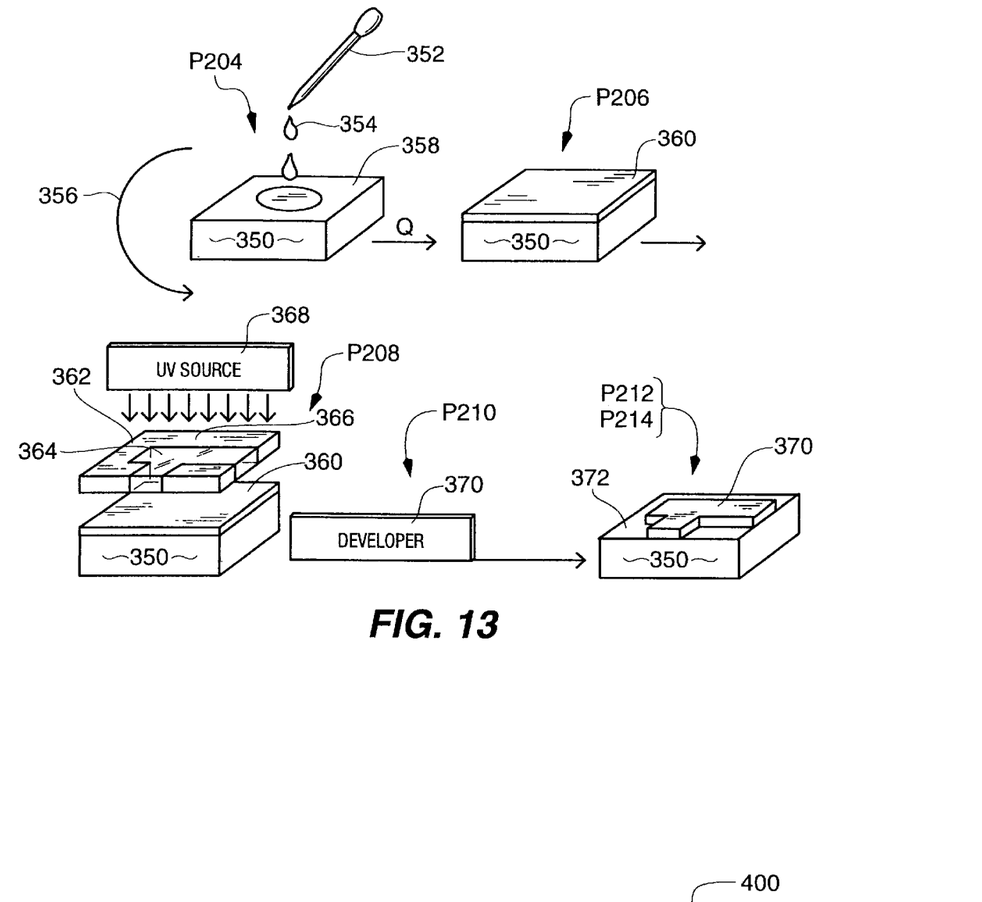
FIG. 13 depicts a wafer in sequential stagers of processing according to the FIG. 9 process.

FIG. 13 depicts the sequential steps performed upon a substrate 350 during the course of process P200. In step P204, an eyedropper 352 is used to deposit drops of a photosensitive liquid precursor solution 354 according to the present invention while substrate 350 is spuny in a direction 356. The uppermost surface 358 of wafer 350 is exposed to receive liquid precursor solution 354. Substrate 350 is soft baked in step P206 with the application of heat Q to provide a soft baked precursor film 360. In step P208, a photomask 362 having a light transmission area 364 and a light blocking area 366 is placed between the soft-baked precursor film 360 and an ultraviolet radiation source 368. In step P210, substrate 350 is placed in a developer solution 370. After steps P212 (rinsing) and P214 (drying), substrate 350 includes a pattern 370 of dried precursor residue. The remaining portions of liquid precursor that formerly covered region 372 dissolved in the developer solution 370.

Figure 14:
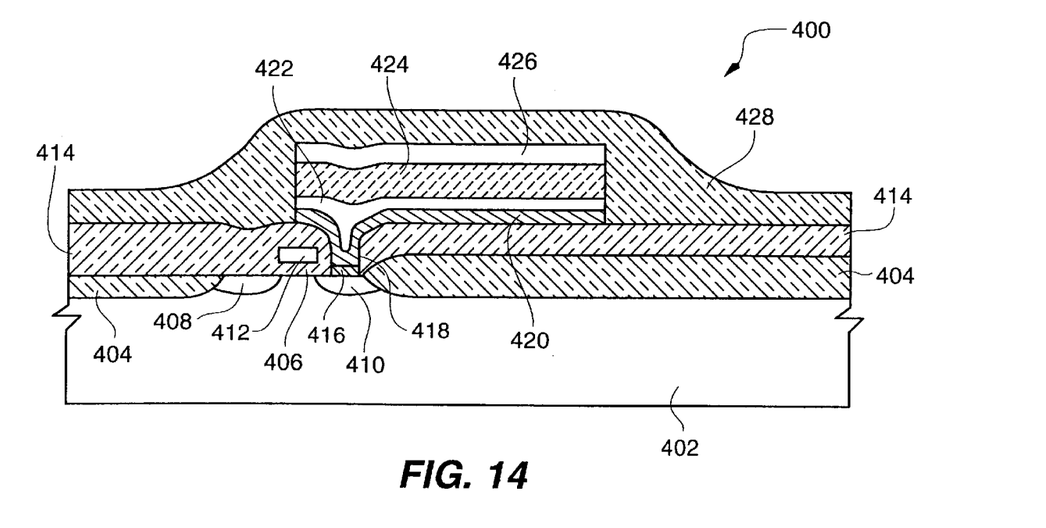
FIG. 14 depicts a crossectional view of an integrated circuit including metal oxide layers produced by the FIG. 9 process.

FIG. 14 depicts a cross-sectional view of an exemplary integrated circuit device 400. Additional details pertaining to the nature and operation of this type of device can be found in U.S. Pat. No. 5,561,307, except device 400 includes at least one metal oxide layer that is produced by the method described in FIG. 9. In addition, the method shown in FIG. 9 may be used in to construct any other type of integrated circuit device.

Wafer 402 is a lightly doped p-type single crystal silicon wafer that has been oxidized by a conventional localized oxidation of silicon process to form thick field oxide regions 404 and a thin transistor gate insulating layer 406. Wafer 402 has been exposed to conventional ion implantation processing to provide active areas 408 and 410. A transistor gate 412 is preferably made of doped polysilicon, and is surrounded by an insulating protective layer 414 of spin-on glass. A metal suicide contact 416 is deposited in an etched contact hole 418 extending through protective layer 414. A titanium nitride or silicon nitride diffusion barrier layer 420 is deposited in contact hole 418 and over protective layer 414. A bottom electrode 422 is deposited over barrier layer 420, and may consist of platinum or a conductive metal oxide. Metal oxide layer 424 is preferably a dielectric or ferroelectric perovskite material, and is deposited over bottom electrode 422. A top electrode 426 is deposited over metal oxide layer 424. An insulating layer 428 covers the other components to protect them. Metal oxide layers that can be deposited by the method shown in FIG. 9 include layers 424 and 428.

The following examples set forth preferred methods and materials for practicing the present invention.

EXAMPLE 1

PREPARATION OF A 0.23 MOLE/Kg SOLUTION FOR MAKING $(Ba_{0.7}Sr_{0.3})TiO_3$

The following materials were purchased from a commercial supplier and weighed in the amounts shown.

TABLE 1

| Material | Molecular Weight (g/mole) | Weight (g) | Milimoles | Supplier |
|---|---|---|---|---|
| $Ba(OOCCH_3)_2$ | 255.43 | 2.048 | 8.018 | Aldrich |
| $Sr(OOCCH_3)_2$ | 205.71 | 0.707 | 3.437 | Aldrich |
| $CH_3COOH$ | 60.05 | 38.0 | 632.8 | Aldrich |
| $(CH_3CO)_2O$ | 102.09 | 1.0 | 9.795 | Aldrich |
| 2,4-pentanedione | 100.12 | 3.45 | 34.5 | Aldrich |
| $Ti(OCH(CH_3)_2)_4$ | 284.26 | 3.265 | 11.49 | Aldrich |
| $H_2O$ | 18.02 | 0.62 | 34.4 | (distilled) |
| $CH_3COOH$ | 60.05 | Balance | | Aldrich |

The barium acetate (2.048 g). strontium acetate (0.707 g), acetic acid (38.0 g), and acetic anhydride (1.0 g) were measured into an Erlenmeyer flask equipped with a reflux condenser. The reaction mixture was heated on a hot plate at 200° C. for ten hours with constant magnetic stirring. The reflux condenser was opened to distill about 15 g of solvent from the mixture. The flask was removed from the hot plate, and the solution stood to a temperature less than 100° C. 2,4-pentanedione (3.45 g) and titanium isopropoxide (3.265 g) were measured into the hot reaction mixture, which was reheated on a hot plate at 130° C. for thirty minutes. The flask was removed from the hot plate, and the solution stood to room temperature. Water (0.62 g) and acetic acid (balance) were added to adjust the solution concentration to 0.23 mol/kg. The total weight of the final solution was 50.0 g. The solution was designed to yield, upon calcination in an oxygen-containing atmosphere, a barium strontium titanate metal oxide having the formulation $(Ba_{0.7}Sr_{0.3})TiO_3$. This metal oxide composition has an extremely high dielectric constant, and is not ferroelectric at normal integrated circuit operating temperatures.

EXAMPLE 2

PREPARATION OF A 0.23 MOLE/Kg SOLUTION FOR MAKING $(Ba_{0.1}Sr_{0.9})TiO_3$

The following materials were purchased from a commercial supplier and weighed in the amounts shown.

TABLE 2

| Material | Molecular Weight (g/mole) | Weight (g) | Milimoles | Supplier |
|---|---|---|---|---|
| $Ba(OOCCH_3)_2$ | 255.43 | 0.293 | 1.147 | Aldrich |
| $Sr(OOCCH_3)_2$ | 205.71 | 2.126 | 10.335 | Aldrich |
| $CH_3COOH$ | 60.05 | 38.0 | 632.8 | Aldrich |
| $(CH_3CO)_2O$ | 102.09 | 1.0 | 9.795 | Aldrich |
| 2,4-pentanedione | 100.12 | 3.45 | 34.5 | Aldrich |
| $Ti(OCH(CH_3)_2)_4$ | 284.26 | 3.265 | 11.49 | Aldrich |
| $H_2O$ | 18.02 | 0.62 | 34.4 | (distilled) |
| $CH_3COOH$ | 60.05 | Balance | | Aldrich |

The barium acetate (0.293 g). strontium acetate (2.126 g), acetic acid (38.0 g), and acetic anhydride (1.0 g) were measured into an Erlenmeyer flask equipped with a reflux condenser. The reaction mixture was heated on a hot plate at 200° C. for ten hours with constant magnetic stirring. The reflux condenser was opened to distill about 15 g of solvent from the mixture. The flask was removed from the hot plate, and the solution stood to a temperature less than 100° C. 2,4-pentanedione (3.45 g) and titanium isopropoxide (3.265 g) were measured into the hot reaction mixture, which was reheated on a hot plate at 130° C. for thirty minutes. The flask was removed from the hot plate, and the solution stood to room temperature. Water (0.62 g) and acetic acid (balance) were added to adjust the solution concentration to 0.23 mol/kg. The total weight of the final solution was 50.0g. The solution was designed to yield, upon calcination in an oxygen-containing atmosphere, a barium strontium titanate metal oxide having the formulation $(Ba_{0.1}Sr_{0.9})TiO_3$.

EXAMPLE 3

PREPARATION OF A 0.23 MOLE/Kg SOLUTION FOR MAKING $(Ba_{0.7}Sr_{0.3})TiO_3$

The following materials were purchased from a commercial supplier and weighed in the amounts shown.

TABLE 3

| Material | Molecular Weight (g/mole) | Weight (g) | Milimoles | Supplier |
|---|---|---|---|---|
| $Ba(OOCCH_3)_2$ | 255.43 | 2.048 | 8.018 | Aldrich |
| $Sr(OOCCH_3)2$ | 205.71 | 0.707 | 3.437 | Aldrich |
| $CH_3COOH$ | 60.05 | 38.0 | 632.8 | Aldrich |
| $(CH_3CO)_2O$ | 102.09 | 1.0 | 9.795 | Aldrich |
| ethyl acetoacetate | 130.14 | 4.75 | 36.5 | Aldrich |
| $Ti(OCH(CH_3)_2)_4$ | 284.26 | 3.265 | 11.49 | Aldrich |
| $H_2O$ | 18.02 | 0.62 | 34.4 | (distilled) |
| $CH_3COOH$ | 60.05 | Balance | | Aldrich |

The barium acetate (2.048 g), strontium acetate (0.707 g), acetic acid (38.0 g), and acetic anhydride (1.0 g) were measured into an Erlenmeyer flask equipped with a reflux condenser. The reaction mixture was heated on a hot plate at 200° C. for ten hours with constant magnetic stirring. The reflux condenser was opened to distill about 15 g of solvent from the mixture. The flask was removed from the hot plate, and the solution stood to a temperature less than 100° C. Ethyl acetoacetate (4.75 g) and titanium isopropoxide (3.265 g) were measured into the hot reaction mixture, which was reheated on a hot plate at 130° C. for thirty minutes. The flask was removed from the hot plate, and the solution stood to room temperature. Water (0.62 g) and acetic acid (balance) were added to adjust the solution concentration to 0.23 mol/kg. The total weight of the final solution was 50.0 g. The solution was designed to yield, upon calcination in an oxygen-containing atmosphere, a barium strontium titanate metal oxide having the formulation $(Ba_{0.7}Sr_{0.3})TiO_3$.

EXAMPLE 4

PREPARATION OF A 0.25 MOLE/Kg SOLUTION FOR MAKING $(Ba_{0.9}Sr_{0.1})TiO_3$

The following materials were purchased from a commercial supplier and weighed in the amounts shown.

TABLE 4

| Material | Molecular Weight (g/mole) | Weight (g) | Milimoles | Supplier |
|---|---|---|---|---|
| $Ba(OOCCH_3)_2$ | 255.43 | 2.874 | 11.252 | Aldrich |
| $Sr(OOCCH_3)_2$ | 205.71 | 0.257 | 1.249 | Aldrich |
| $CH_3COOH$ | 60.05 | 39.0 | 649 | Aldrich |
| 2,4-pentanedione | 100.12 | 1.25 | 12.5 | Aldrich |
| $Ti[OCH(CH_3)]_2(CH_3C OCHCOCH_3)_2$ | 364.27 | 4.553 | 12.5 | Strem |
| $H_2O$ | 18.02 | 0.68 | 37.7 | (distilled) |
| $CH_3COOH$ | 60.05 | Balance | | Aldrich |

The barium acetate (2.874 g), strontium acetate (0.257 g), and acetic acid (39.0 g), were measured into an Erlenmeyer flask equipped with a reflux condenser. The reaction mixture was heated on a hot plate at 200° C. for six hours with constant magnetic stirring. The reflux condenser was opened to distill about 15 g of solvent from the mixture. The flask was removed from the hot plate, and the solution stood to a temperature less than 100° C. 2, 4-pentanedione (1.25 g) and titanium (diisopropoxide)bis(acetylacetonate) (4.553 g) were measured into the hot reaction mixture, which was reheated on a hot plate at 130° C. for thirty minutes. The flask was removed from the hot plate, and the solution stood to room temperature. Water (0.62 g) and acetic acid (balance) were added to adjust the solution concentration to 0.25 mol/kg. The total weight of the final solution was 50.0 g. The solution was designed to yield, upon calcination in an oxygen-containing atmosphere, a barium strontium titanate metal oxide having the formulation $(Ba_{0.9}Sr_{0.1})TiO_3$.

EXAMPLE 5

PREPARATION OF A 0.25 MOLE/Kg SOLUTION FOR MAKING $(Ba_{0.5}Sr_{0.5})TiO_3$

The following materials were purchased from a commercial supplier and weighed in the amounts shown.

TABLE 5

| Material | Molecular Weight (g/mole) | Weight (g) | Milimoles | Supplier |
|---|---|---|---|---|
| $Ba(OOCCH_3)_2$ | 255.43 | 1.596 | 6.248 | Aldrich |
| $Sr(OOCCH_3)_2$ | 205.71 | 1.286 | 6.251 | Aldrich |
| $CH_3COOH$ | 60.05 | 39.0 | 649 | Aldrich |
| Ethyl acetoacetate | 130.14 | 1.63 | 12.5 | Aldrich |
| $Ti[OCH(CH_3]_2(CH_3C OCHCOCH_3)_2$ | 364.27 | 4.553 | 12.50 | Strem |
| $H_2O$ | 18.02 | 0.68 | 37.7 | (distilled) |
| $CH_3COOH$ | 60.05 | Balance | | Aldrich |

The barium acetate (1.596 g), strontium acetate (1.286), and acetic acid (39.0 g), were measured into an Erlenmeyer flask equipped with a reflux condenser. The reaction mixture was heated on a hot plate at 200° C. for six hours with constant magnetic stirring. The reflux condenser was opened to distill about 15 g of solvent from the mixture. The flask was removed from the hot plate, and the solution stood to a temperature less than 100° C. Ethyl acetoacetate(1.63 g) and titanium (diisopropoxide)bis(acetylacetonate) (4.553 g) were measured into the hot reaction mixture, which was reheated on a hot plate at 130° C. for thirty minutes. The flask was removed from the hot plate, and the solution stood to room temperature. Water (0.68 g) and acetic acid (balance) were added to adjust the solution concentration to 0.25 mol/kg. The total weight of the final solution was 50.0g. The solution was designed to yield, upon calcination in an oxygen-containing atmosphere, a barium strontium titanate metal oxide having the formulation $(Ba_{0.5}Sr_{0.5})TiO_3$.

EXAMPLE 6

USING A PHOTOSENSITIVE LIQUID PRECURSOR SOLUTION TO MAKE INTEGRATED CIRCUIT-QUALITY METAL OXIDE THIN FILMS

Process P200 of FIG. 4 was used to make an integrated circuit thin film. A conventional substrate formed of a silicon wafer having an oxide layer and a sputter-deposited platinum/titanium electrode was placed in a standard spin-coating machine. About two ml of the 0.23 mol/kg barium strontium solution of FIG. 1 was applied to the substrate using an eyedropper while the substrate spun at 500 rpm. revolution speed was increased to 1500 rpm for an additional thirty seconds to provide a film of the liquid precursor covering the electrode.

The liquid-coated precursor was soft-baked by placement on a hot plate heated to 100° C. in air for one minute. The soft-baked film was irradiated under a mask by exposure to low pressure mercury-source ultraviolet radiation having a wavelength of about 254 nm. Cumulative irradiation energy was about one Joule., and this established a polymerized pattern in the solution film.

The pattern was developed by placing the ultraviolet-exposed substrate in an agitation bath containing a 95:5 mixture of ethanol and water. The bath was agitated with mild motion for thirty seconds to develop the exposed negative pattern. The developed substrate was placed in a rinse bath containing n-butylacetate and mildly agitated for thirty seconds. After rinsing, the substrate was blown with a nitrogen air gun, placed on a hot plate at 140° C. for one minute, and subjected to rapid thermal processing for thirty seconds at 650° C. under oxygen.

The steps of depositing the precursor, soft-baking, irradiating, developing, rinsing, and drying were repeated one time to increase the patterned film thickness.

The dried, patterned film was annealed in an oxygen diffusion furnace at 750° C. for one hour and twenty minutes including ten minutes each for the ramp into the furnace and the ramp out of the furnace. The device was completed by sputtering a platinum top electrode and patterning the top electrode in a conventional reactive ion etching procedure to form a plurality of integrated circuit capacitor devices on the wafer. Each capacitor device had an area of 1960 $\mu m^2$ and an film thickness of about 2300 Å.

Figure 15:
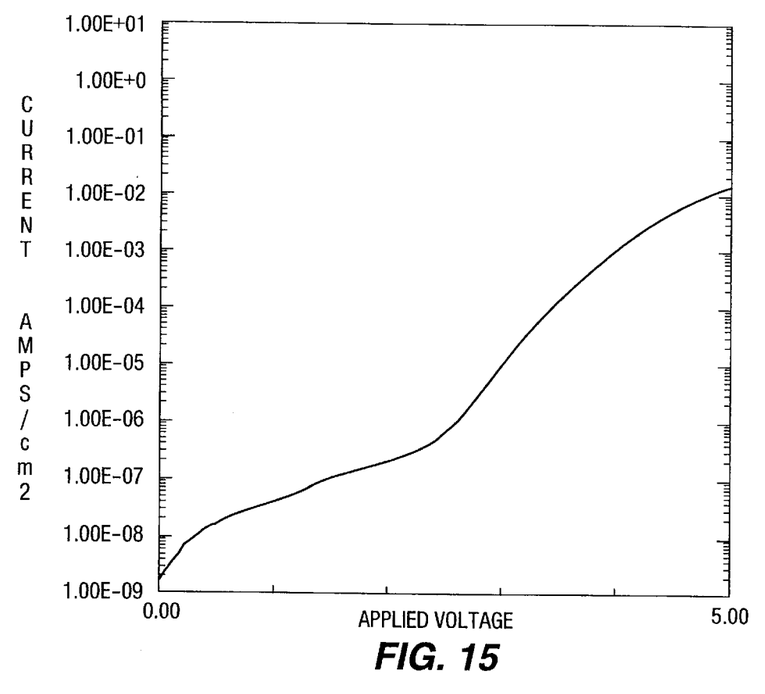
FIG. 15 is a plot of leakage current versus voltage data obtained from an integrated circuit capacitor device that was produced according to the present invention.

FIG. 15 depicts a plot of leakage current versus voltage for the film. This data was obtained by using a Hewlett Packard 4145A semiconductor parameter analyzer to study a representative capacitor device from the wafer at 22° C. FIG. 15 shows a substantially linear relationship between voltage and current with a leakage current of less than $10^{-4}$ A at 3V.

Figure 16:
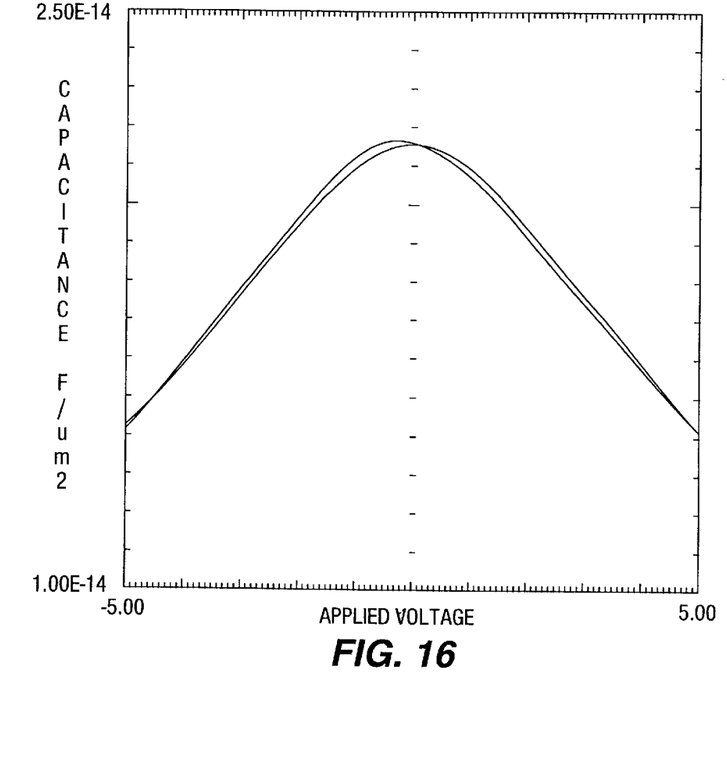
FIG. 16 is a plot of capacitance versus voltage data obtained from an integrated circuit capacitor device that was produced according to the present invention.

FIG. 16 depicts a plot of capacitance versus voltage from a representative capacitor on the wafer at 22° C. This data was obtained by using a Hewlett Packard 4275A LCR meter to apply voltage at a frequency of 10 KHz having an oscillation amplitude of 0.141.

Those skilled in the art understand that the preferred embodiments described above may be modified without departing from the true scope and spirit of the invention. The inventors, accordingly, hereby state their intention to rely upon the Doctrine of Equivalents, in order to protect their full rights in the invention.

We claim:

1. A photosensitive device-patterning method for use in making integrated circuits, said method comprising the steps of:

providing a metal organic liquid solution including (A) a metal organic portion including at least one titanium compound selected from the group consisting of titanium carboxydiketonates, titanium carboxyketoesters, and mixtures thereof, and (B) a solvent mixed with said metal organic portion in an effective amount for yielding a metal oxide film including metal from said metal organic compound upon application of said metal organic liquid solution to an integrated circuit substrate followed by drying and annealing of said metal organic liquid solution;

applying said metal organic liquid solution to an integrated circuit substrate to form a film of said metal organic liquid solution; and exposing said film to a pattern of ultraviolet radiation to make at least a portion of said film resistant to a developer solution capable of dissolving portions of said film not exposed to said ultraviolet radiation.

2. The method as set forth in claim 1 including a step of baking said film at a temperature ranging from 80° C. to 1200° C. prior to said step of exposing said film.

3. The method as set forth in claim 1 including a step of developing said film after said exposing step.

4. The method as set forth in claim 3 wherein said step of developing said film includes contacting said film with a mixture of ethanol and water.

5. The method as set forth in claim 3 including a step of rinsing said film after said step of developing said film.

6. The method as set forth in claim 5 wherein said step of rinsing said film includes contacting said film with n-butylacetate.

7. The method as set forth in claim 6 including a step of drying said film by heating the same to a temperature ranging from 200° C. to 500° C. after said step of rinsing said film.

8. The method as set forth in claim 1 including a step of annealing said film to form a metal oxide by heating said film in an oxygen-containing atmosphere to a temperature ranging from 450° C. to 1,000° C.

9. The method as set forth in claim 8 including a step of completing formation of an integrated circuit device including said metal oxide.

10. The method as set forth in claim 1 wherein said metal organic portion in said providing step includes said titanium compound being a titanium carboxyβ-diketone having a molecular formula wherein R, $R_1$, and $R_3$ are, respectively, selected from the group consisting of aliphatic hydrocarbon chains having from one to five carbon atoms; and $R_2$ and $R_4$ are, respectively, selected from the group consisting of aliphatic hydrocarbon chains having from one to five carbon atoms and aromatic hydrocarbon chains.

11. The method as set forth in claim 10 wherein R, $R_1$, $R_2$, $R_3$, and $R_4$ are, respectively, selected from the group consisting of methyl, ethyl, n-propyl, isopropyl, n-butyl, sec-butyl, tert-butyl, neopentyl, and tert pentyl hydrocarbon chains.

12. The method as set forth in claim 10 wherein R, $R_1$, $R_2$, $R_3$, and $R_4$ are alkyl.

13. The method as set forth in claim 1 wherein said metal organic portion in said providing step includes said titanium compound being a titanium carboxyβ-ketoester having a molecular formula wherein R, $R_1$, and $R_3$ are, respectively, selected from the group consisting of aliphatic hydrocarbon chains having from one to five carbon atoms; and $R_2$ and $R_4$ are, respectively, selected from the group consisting of aliphatic hydrocarbon chains having from one to five carbon atoms and aromatic hydrocarbon chains.

14. The method as set forth in claim 13 wherein R, $R_1$, $R_2$, $R_3$, and $R_4$ are, respectively, selected from the group consisting of methyl, ethyl, n-propyl, isopropyl, n-butyl, sec-butyl, tert-butyl, neopentyl, and tert pentyl hydrocarbon chains.

15. The method as set forth in claim 13 wherein R, $R_1$, $R_2$, $R_3$, and $R_4$ are alkyl.

16. The method as set forth in claim 1 wherein said metal organic portion in said providing step includes said titanium compound a titanium carboxyβ-ketoesterβdiketonate having a molecular formula wherein R, $R_1$, and $R_3$ are, respectively, selected from the group consisting of aliphatic hydrocarbon chains having from one to five carbon atoms; and $R_2$ and $R_4$ are, respectively, selected from the group consisting of aliphatic hydrocarbon chains having from one to five carbon atoms and aromatic hydrocarbon chains.

17. The method as set forth in claim 10 wherein R, $R_1$, $R_2$, $R_3$, and $R_4$ are, respectively, selected from the group consisting of methyl, ethyl, n-propyl, isopropyl, n-butyl, sec-butyl, tert-butyl, neopentyl, and tert pentyl hydrocarbon chains.

18. The method as set forth in claim 10 wherein R, $R_1$, $R_2$, $R_3$, and $R_4$ are alkyl.

* * * * *